(12) United States Patent
Chen et al.

(10) Patent No.: US 6,698,646 B2
(45) Date of Patent: Mar. 2, 2004

(54) ROOM TEMPERATURE GOLD WIRE BONDING

(75) Inventors: Kim H Chen, Fremont, CA (US); Soojin Choi, Santa Clara, CA (US); Chun Yee Chan, Singapore (SG); Johnny Monis Nigos, Singapore (SG)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/241,495

(22) Filed: Sep. 11, 2002

(65) Prior Publication Data

US 2003/0006271 A1 Jan. 9, 2003

Related U.S. Application Data

(62) Division of application No. 09/882,135, filed on Jun. 14, 2001.
(51) Int. Cl.⁷ .................................................. B23K 1/06
(52) U.S. Cl. .................................................. 228/180.5
(58) Field of Search .......................... 228/180.5, 110.1, 228/4.5, 1.1; 257/E21.518

(56) References Cited

U.S. PATENT DOCUMENTS

| 5,660,319 A | | 8/1997 | Falcone et al. |
| 5,894,983 A | * | 4/1999 | Beck et al. .............. 228/110.1 |
| 5,984,162 A | | 11/1999 | Hortaleza |

FOREIGN PATENT DOCUMENTS

| DE | 4232745 | 3/1994 |
| DE | 19809081 | 9/1999 |

* cited by examiner

*Primary Examiner*—Tom Dunn
*Assistant Examiner*—Jonathan Johnson
(74) *Attorney, Agent, or Firm*—Judy Liao Shie

(57) ABSTRACT

The present invention is a method for bonding gold wire to gold bond pads at temperatures lower than 125 degrees Celsius, and more particularly at room temperature, defined to be 25 degrees Celsius. By applying compressive force and ultrasonic energy, an intermetallic bond can be formed between a gold wire and a gold bond pad without elevating the temperature. Furthermore, the present invention uses ultrasonic energy with frequencies low enough to be in the range of commercially available wire bonders.

11 Claims, 3 Drawing Sheets

ROOM TEMPERATURE GOLD WIRE BONDING

This is a Divisional of copending application Ser. No. 09/882,135, filed on Jun. 14, 2001, the entire disclosure of which is incorporated herein by reference.

BACKGROUND

The present invention relates generally to the field of wire interconnect, and more particularly to gold wire bonding at room temperature.

Wire bonding is used to electrically connect two devices together. In the integrated circuit (IC) industry, wire bonding connects IC chips to package leadframes or printed circuit boards (PCB). Aluminum and gold are the predominant choices for the wire used in wire bonding. Gold is more conductive, malleable, and resistant to corrosion than aluminum, so it is the preferred interconnect metal when the aforementioned properties are important.

Two common methods for bonding gold wire are thermocompression and thermosonic bonding. In thermocompression, pressure and heat are applied to the wire and bond pad interface to make a metallic bond. The heating of the interface results in temperatures around 250 degrees Celsius. In thermosonic bonding, heat and ultrasonic energy are applied to the wire and bond pad interface to form a metallic bond. Typical temperatures for thermosonic bonding are around 125 degrees Celsius. Both methods require heat to make a bond. Unfortunately, there are many sensitive devices such as the Agilent All Optical Switch that cannot tolerate high heat. The elevated temperatures used in both thermocompression and thermosonic bonding would ruin these devices. Devices bonded using these two methods also require warm-up and cool-down periods during assembly. These time-consuming delays slow down the entire manufacturing process.

In U.S. Pat. No. 5,984,162 (hereinafter, "the '162 patent"), a method is described for bonding gold wire to aluminum bond pads at room temperature, using ultrasonic energy and compressive force. However, the high frequencies (above 200 kHz, particularly in the range of 235 to 245 kHz) of ultrasonic energy necessary to the method taught in the '162 patent are not currently available in commercial wire bonders. Instead, wire bonders must be specially modified to produce the frequencies called for in the '162 patent. Furthermore, the '162 patent requires modification of the capillary device that holds the wire. Modifications such as these make the method of the '162 patent cumbersome to implement.

Accordingly, there remains a need for a method of bonding gold wire at decreased temperatures, preferably at room temperature, at a frequency lower than 200 kHz, particularly at frequencies produced by current, unmodified, commercial wire bonders.

SUMMARY

The present invention is a method for bonding gold wire at lower temperatures, and more particularly at room temperature, defined to be 25 degrees Celsius. By applying compressive force and ultrasonic energy, an intermetallic bond can be formed between a gold wire and a gold bond pad without applying heat. Furthermore, the present invention uses ultrasonic energy with frequencies low enough to be in the range of commercially available wire bonders.

In a preferred embodiment, the gold wire is vibrated against a gold bond pad at frequencies between 100–138 kHz, with power between 75–220 mW, a force between 40–150 grams, and a bond time between 20–70 milliseconds. Commercially available bonders such as the Advanced Semiconductor Materials (ASM) AB 339 can readily produce these aforementioned parameters. No modification of the AB 339 is needed to bond gold wire to gold bond pads at room temperature.

Further features of the present invention, as well as the structure and operation of preferred embodiments of the present invention, are described in detail below with reference to the accompanying exemplary drawings. In the drawings, like reference numbers indicate identical or functionally similar elements.

DETAILED DESCRIPTION

The present invention is a method to bond gold wire to a gold bond pad at room temperature, using commercially available wire bonders. Ultrasonic energy and compressive force are applied to the gold wire and gold bond pad interface, without elevating the temperature, to create a metallic bond.

Figure 1:
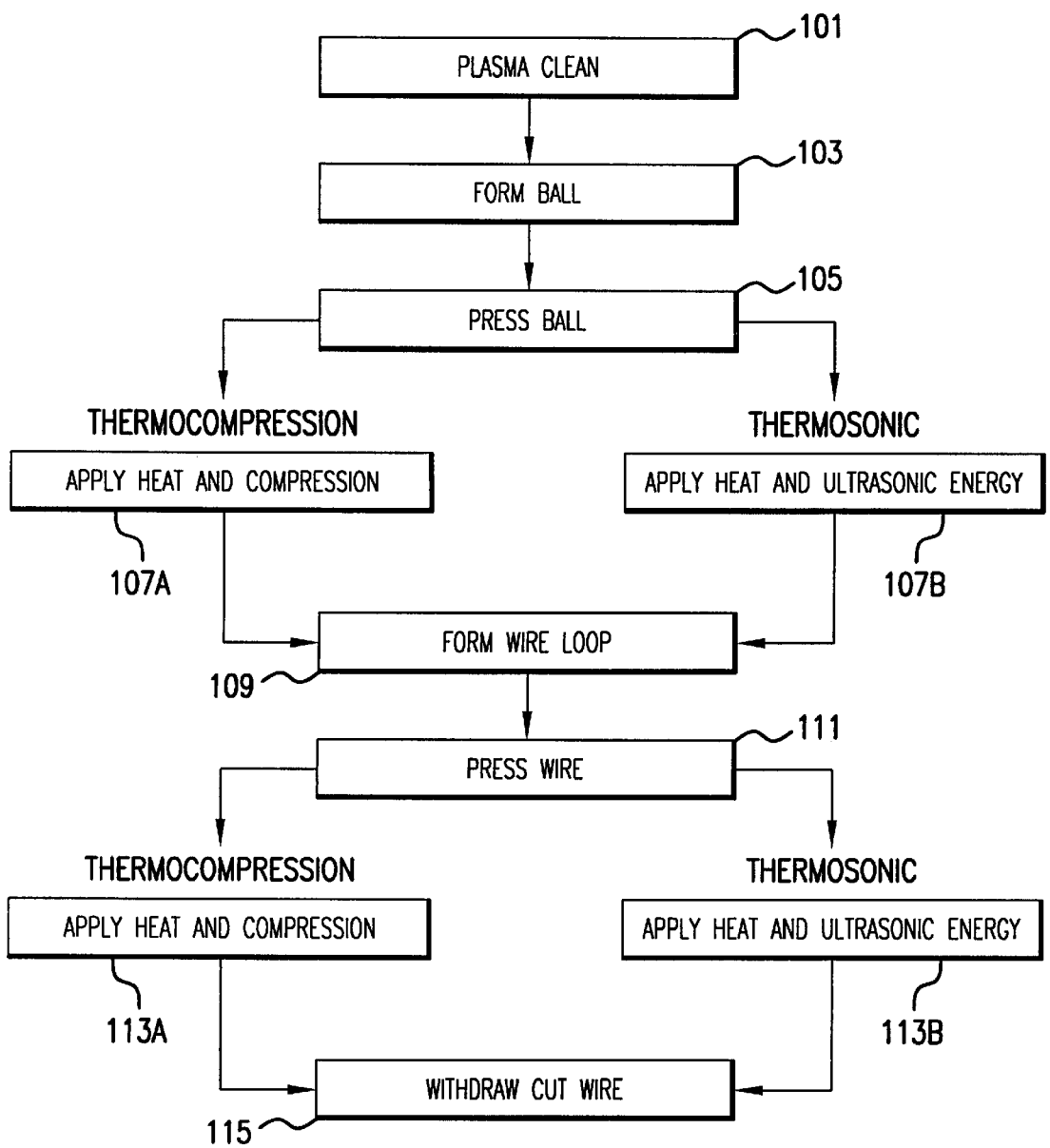
FIG. 1 is a flowchart of prior art, illustrating the steps required to bond gold wire to gold bond pads.

FIG. 1 is a flowchart diagramming the steps taken in prior art to bond gold wire to a gold bond pad. In Step 101, the surfaces of the gold bond pads are thoroughly cleaned using a process known as plasma cleaning. Plasma cleaning cleans at a molecular level by bombarding the surfaces with ionized gas such as argon. In Step 103, a gold ball is formed at an end of the gold wire by electrically sparking the bonding end of the gold wire. In Step 105, the gold ball is pressed against the surface of a first gold bond pad, typically on an IC. The next step depends on whether thermocompression or thermosonic bonding is selected. Step 107A describes thermocompression: heat and compressive force are simultaneously applied to the gold ball and first gold bond pad to form a ball bond. Step 107B describes thermosonic bonding: heat and ultrasonic energy are simultaneously applied to the gold ball and first gold bond pad to form a ball bond.

Once the ball bond is formed, the gold wire is drawn to a second gold bond pad, typically on a package leadframe or a PCB, to form a wire loop 109. The gold wire is pressed against the second gold bond pad in Step 111. Then, either thermocompression 113A or thermosonic 113B bonding is selected again to form a metallic bond. The bond formed at this point is known as a wedge bond. After the wedge bond is formed, the wire is cut and withdrawn 115.

Figure 2:
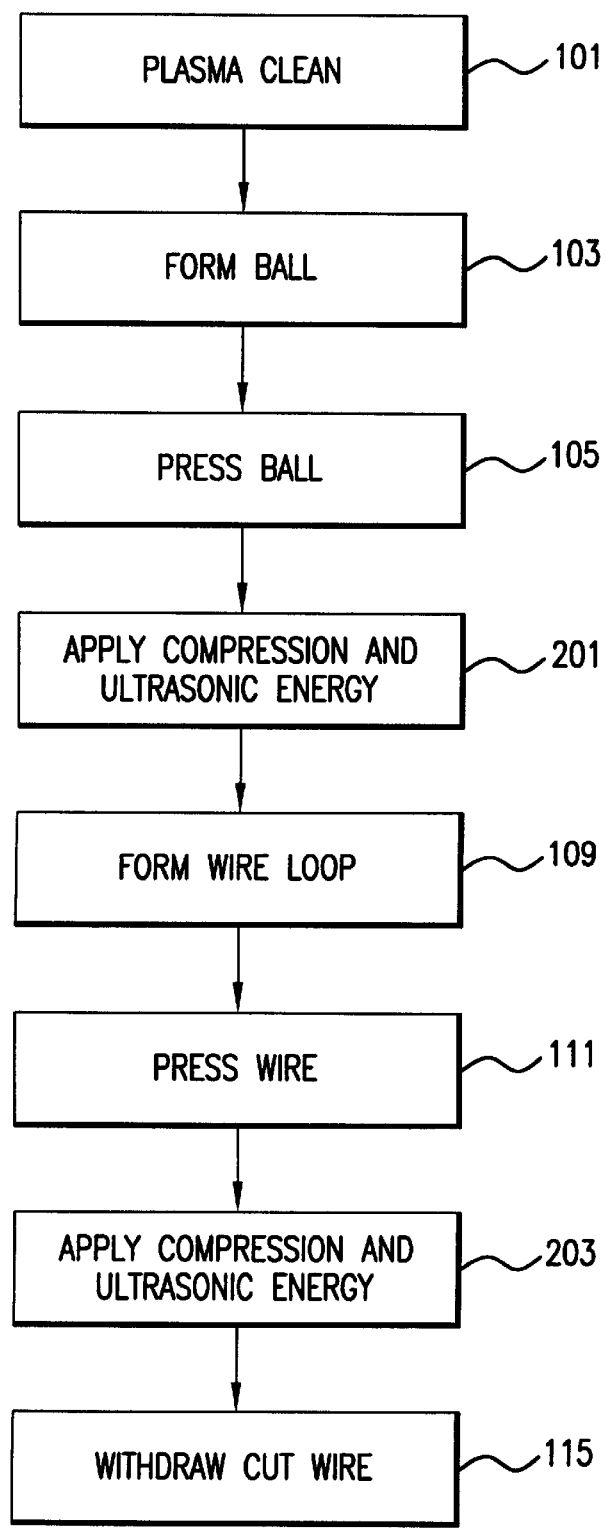
FIG. 2 is a flowchart of the present invention, illustrating the steps required to bond gold wire to gold bond pads.

FIG. 2 is a flowchart illustrating the method of a preferred embodiment made in accordance with the teachings of the present invention. Steps 101, 103, 105, 109, 111, and 115 remain as described in the prior art of FIG. 1. However, in Step 201, the compressive force and ultrasonic energy are applied together, without heat, to form a metallic bond between the gold ball and the gold bond pad. Similarly in Step 203, compressive force and ultrasonic energy are applied together, without heat, to form a metallic bond between the gold wire and gold bond pad. The goal of Steps 201 and 203 is to produce a good bond at room temperature, a bond with the same strength as the bonds created by high-temperature methods such as thermocompression or thermosonic bonding. For a 0.0013-inch diameter gold wire, a good bond has a minimum pull strength of 8 grams, and a minimum shear strength of 45 grams.

Other than temperature, the important parameters that have an impact on bonding strength are: ultrasonic frequency, ultrasonic power, force, and bond time. By experimenting with different values for these parameters, an optimum set of parameter values was developed. A commercially available thermosonic wire bonder, ASM's AB 339, was used in these experiments. The AB 339 comes with a heater, but the heater was not turned on or otherwise used in the present invention. No modifications to the AB 339 wire bonder were required, although a custom-built work holder is required for all devices to be bonded. Table 1 lists the empirically derived parameter ranges that resulted in a good bond.

TABLE 1

| Parameter | Range of Values |
|-----------|----------------|
| Frequency | 100–138 kHz |
| Power | 75–220 mW |
| Force | 40–150 gm |
| Bond Time | 20–70 ms |

Figure 3:
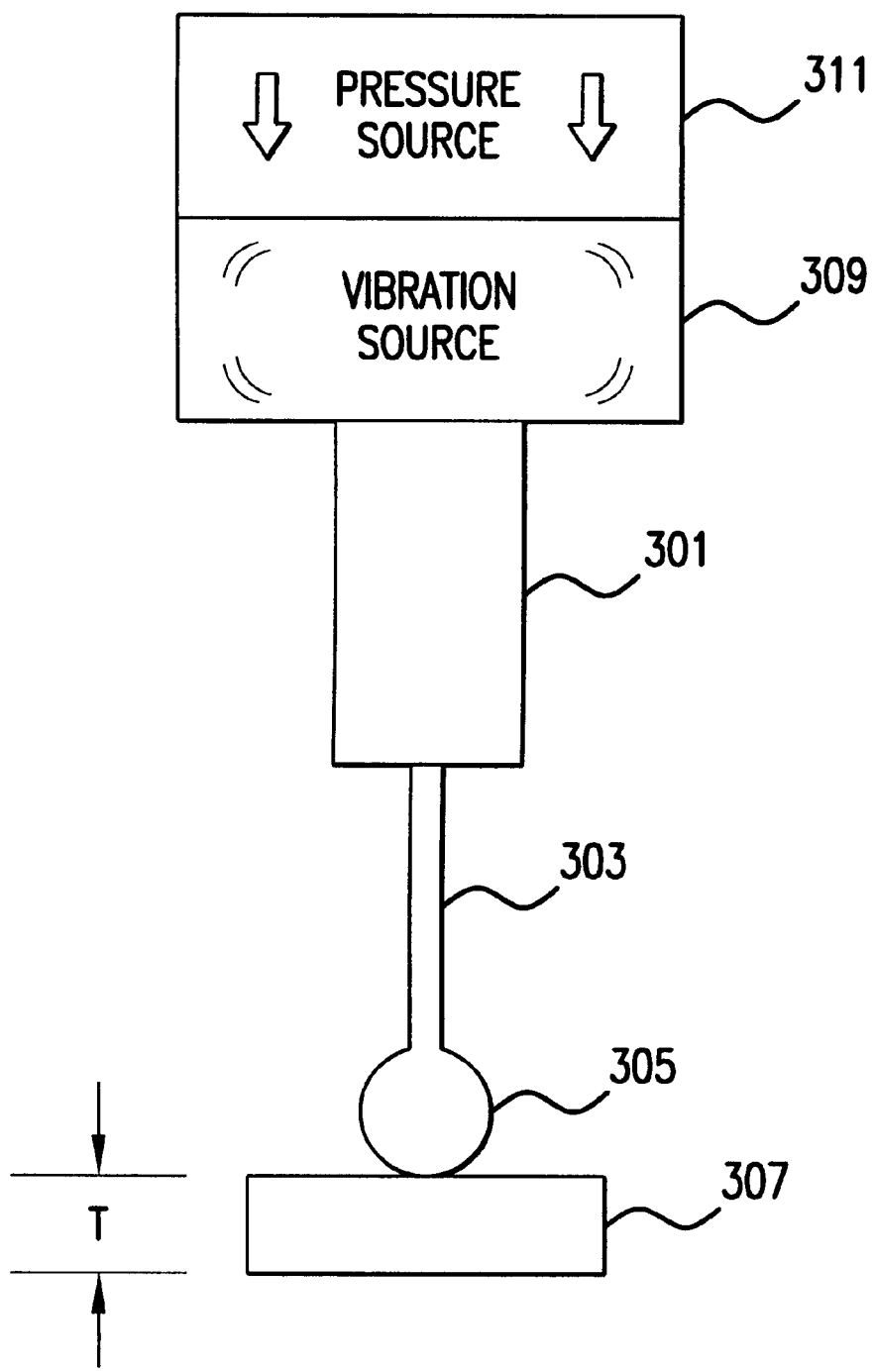
FIG. 3 illustrates an apparatus used to implement room temperature gold wire bonding.

FIG. 3 illustrates an exemplary apparatus to bond gold wire to a gold bond pad. A holder 301 holds a gold wire 303. The end of the gold wire 303 has a gold ball 305, created as described in Step 103 of FIG. 2. The gold ball 305 is in contact with a gold bond pad 307, with a thickness T. A pressure source 311 applies compressive force on the holder 301, the gold wire 303, and the gold ball 305, pushing the gold ball 305 against the gold bond pad 307, with a force in the range listed in Table 1. The holder 301 is connected to a vibration source 309, such as a transducer, that vibrates the gold wire 303 at the desired frequencies and powers listed in Table 1. The thickness T of the gold bond pad and the purity of the gold in the gold bond pad will affect the quality of the bond between the gold wire 303 and gold bond pad 307. The gold bond pad should ideally be about 0.75 to 1.3 microns thick. Additionally, the gold bond pad should be plated using an electrolytic process to ensure gold purity and uniformity.

We claim:

1. A method for bonding gold wire to a gold bond pad, comprising the steps of:

pressing a gold wire against a gold bond pad; and vibrating the gold wire at a frequency lower than 200 kHz and at a power less than 1 watt, to form a metallic bond between the gold wire and gold bond pad.

2. The method of claim 1, wherein the step of vibrating is performed at a frequency less than 140 kHz.

3. The method of claim 2, wherein the step of vibrating is performed at a frequency in the range of 100 kHz through 138 kHz, inclusive.

4. The method of claim 1, wherein the step of vibrating is performed with a power not more than 220 mW.

5. The method of claim 4, wherein the step of vibrating is performed with a power in the range of 75 to 220 mW, inclusive.

6. The method of claim 1, wherein the step of pressing is performed with a static force not more than 150 grams.

7. The method of claim 6, wherein the step of pressing is performed with a static force in the range of 40 to 150 grams, inclusive.

8. The method of claim 1, wherein the step of vibrating is performed for an amount of time not more than 70 milliseconds.

9. The method of claim 8, wherein the step of vibrating is performed for an amount of time in the range of 20 through 70 milliseconds, inclusive.

10. The method of claim 1, wherein the steps of pressing and vibrating are performed at temperatures in the range of 20 to 30 degrees Celsius, inclusive.

11. The method of claim 1, wherein the gold bond pad has been plated using an electrolytic process.

* * * * *